US011781716B2

(12) United States Patent
Zhou et al.

(10) Patent No.: US 11,781,716 B2
(45) Date of Patent: Oct. 10, 2023

(54) LIGHT SOURCE MODULE AND LIGHTING DEVICE INCLUDING IHE SAME

(71) Applicants: SUZHOU OPPLE LIGHTING CO., LTD., Suzhou (CN); OPPLE LIGHTING CO., LTD., Shanghai (CN)

(72) Inventors: Zhixian Zhou, Suzhou (CN); Jie Qiang, Suzhou (CN)

(73) Assignees: SUZHOU OPPLE LIGHTING CO., LTD., Suzhou (CN); OPPLE LIGHTING CO., LTD., Shanghai (CN)

( * ) Notice: Subject to any disclaimer, the term of this patent is extended or adjusted under 35 U.S.C. 154(b) by 0 days.

(21) Appl. No.: 17/540,144

(22) Filed: Dec. 1, 2021

(65) Prior Publication Data

US 2022/0090744 A1    Mar. 24, 2022

Related U.S. Application Data

(63) Continuation of application No. PCT/CN2020/093963, filed on Jun. 2, 2020.

(30) Foreign Application Priority Data

Jun. 5, 2019  (CN) .......................... 201910486895.7
Jun. 5, 2019  (CN) .......................... 201920843798.4

(51) Int. Cl.
    *F21K 9/64*      (2016.01)
    *H01L 33/50*    (2010.01)
    *F21Y 115/10*   (2016.01)

(52) U.S. Cl.
    CPC .............. *F21K 9/64* (2016.08); *H01L 33/504* (2013.01); *F21Y 2115/10* (2016.08)

(58) Field of Classification Search
CPC ....... F21K 9/64; H01L 33/504; F21Y 2115/10
See application file for complete search history.

(56) References Cited

U.S. PATENT DOCUMENTS 8,350,463 B2 *  1/2013  Pohl ..................... C04B 35/6265
                                                                 313/503
2019/0013448 A1 *  1/2019  Nakano ............ C09K 11/77348
(Continued)

FOREIGN PATENT DOCUMENTS

CN        108598244 A       9/2018
CN        108922955 A      11/2018
(Continued)

OTHER PUBLICATIONS

CN108922955 machine translation, 2018 (Year: 2018).*
(Continued)

*Primary Examiner* — Tracie Y Green
(74) *Attorney, Agent, or Firm* — Arch & Lake LLP (57) ABSTRACT

A light source module and a lighting device including the light source module are provided. The light source module includes a first luminous element and a package part covering the first luminous element. The package part includes a first additional illuminant, a second additional illuminant, and a third additional illuminant. The light emitted by the illuminants is mixed to form positive white light which serves as the emitted light of the light source module. The light source module provided by the present disclosure provides an LED positive white light (5000K) light source with high light efficiency, high CS value and high color rendering property by controlling the proportion of luminous energy in different wavelength regions in the total luminous energy. Under the same illumination, the spectrum with high CS value is especially suitable for people to concentrate on learning and working.

20 Claims, 6 Drawing Sheets (56) References Cited

U.S. PATENT DOCUMENTS

2019/0103522 A1* 4/2019 Abe ..................... H05B 45/10
2022/0090761 A1* 3/2022 Zhou ..................... H01L 33/50

FOREIGN PATENT DOCUMENTS

CN 110212076 A 9/2019
CN 110233197 A 9/2019
JP 009030042 A 2/2009

OTHER PUBLICATIONS

European search opinion 2021 (Year: 2022).*
Translation_written opinion pct 2021 (Year: 2021).*
International Search Report of PCT Application No. PCT/CN2020/093963 dated Aug. 27, 2020 with English translation, (4p).

* cited by examiner

LIGHT SOURCE MODULE AND LIGHTING DEVICE INCLUDING IHE SAME

CROSS-REFERENCE TO RELATED APPLICATIONS

The present application is a continuation application of International Application No. PCT/CN2020/093963, filed on Jun. 2, 2020, which claims priority of Chinese Patent Application No. 201910486895.7, filed on Jun. 5, 2019, and Chinese Patent Application No. 201920843798.4, filed on Jun. 5, 2019, the entire disclosures of which are incorporated herein by reference for all purposes.

TECHNICAL FIELD

Examples of the present disclosure relate to a light source module and a lighting device including the light source module.

BACKGROUND

With the arrival and development of the third lighting technology revolution, the incandescent lamp and the halogen lamp have been gradually banned from production and sales by countries all over the world because of their low light efficiency and poor energy saving, and LED lighting appliances have been widely used instead. The existing LED lighting products mainly solve the problems of energy saving, illumination, color, and color rendering. When using LED lighting products, more and more people pay attention to the possible influence of lighting on human body's circadian rhythm. As for the influence of lighting products on human circadian rhythm, circadian stimulus evaluation model may be used to evaluate, that is, the CS value in the industry. Under the same illumination, spectrum with high CS value is especially suitable for people to concentrate on learning and working. At present, the lamps used in school classrooms usually only consider color temperature, illumination, and other indicators, but there is no LED lighting product that can improve students' concentration by improving CS value and give attention to energy saving, illumination, color, and color rendering as well.

SUMMARY

The purpose of the present disclosure is to solve the above problems, and to find an LED positive white light (5000K) light source with high CS value, high color rendering and high light efficiency.

In order to realize the above functions, the technical solution adopted by the present disclosure is to provide a light source module, and the light source module includes a first luminous element and a package part covering the first luminous element. The first luminous element emits first color light with a peak wavelength of 435~465 nm. The package part includes: a first additional illuminant, arranged to receive part of light emitted by the first luminous element and convert the part of light into second color light with a peak wavelength of 485~515 nm, a second additional illuminant, arranged to receive part of light emitted by the first luminous element and convert the part of light into third color light with a peak wavelength of 520~580 nm, and a third additional illuminant, arranged to receive part of light emitted by the first luminous element and convert the part of light into fourth color light with a peak wavelength of 615~655 nm. The first color light, the second color light, the third color light, and the fourth color light are mixed to form emitted light of the light source module, and the emitted light is neutral white light in CIE1931 color space, and the emitted light is within an interval surrounded by points with a correlated color temperature of 5000±350K and a distance from blackbody locus of duv=−0.006~0.006.

DETAILED DESCRIPTION

The light source module and lighting device according to the present schematic will be further described in detail with reference to the drawings and some examples in accordance with the present disclosure.

Figure 1:
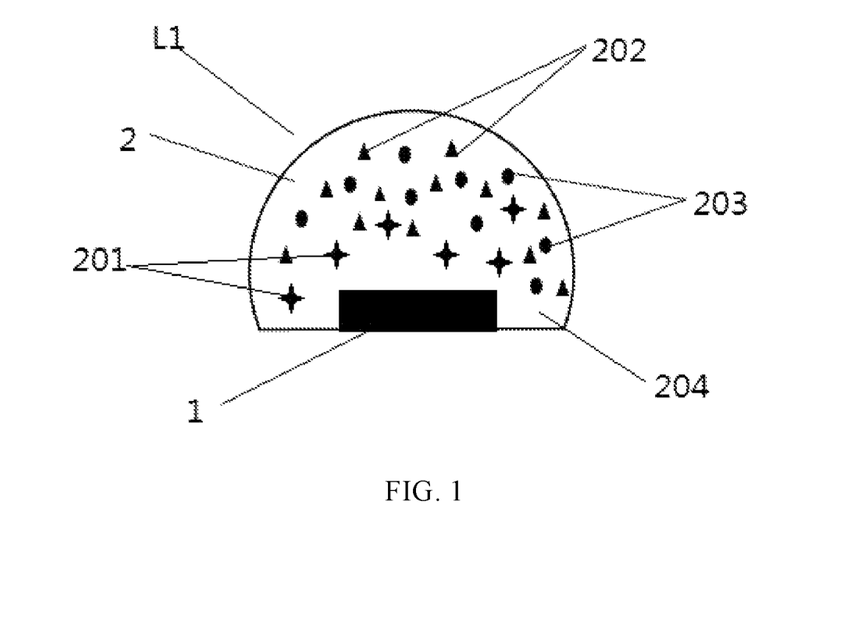
FIG. 1 is a schematic structural diagram of a light source module according to an example of the present disclosure.
Figure 12:
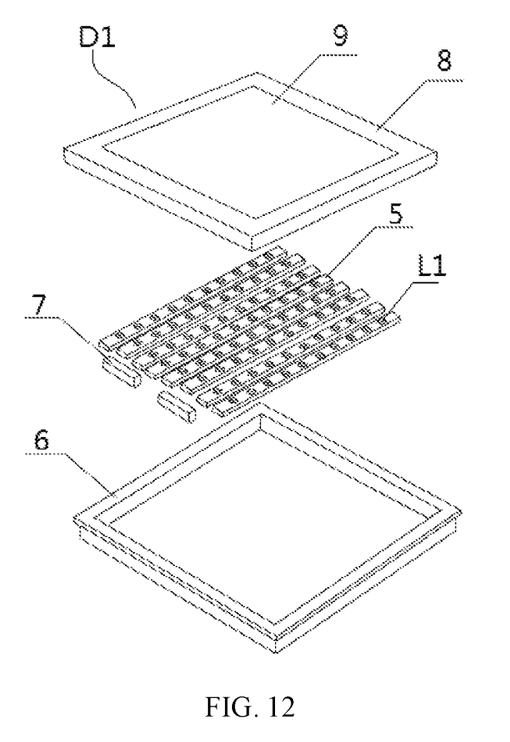
FIG. 12 is a schematic structural diagram of a lamp according to an example of the present disclosure.

As shown in FIG. 1, a light source module L1 according to an example of the present disclosure is a light source product, and the light source module L1 may be applied to a lighting device D1 shown in FIG. 12 to provide lighting for the classroom. The lighting device D1 is a lamp panel, in other preferred examples, the lighting device D1 may also be a ceiling lamp or a ceiling-mounted luminaire, or the light source module L1 may also be applied to various lamps such as the table lamp, the downlight, the spotlight, etc. The lighting device D1 comprises a chassis 6, a face frame 8 provided with a diffusion plate 9, the light source module L1 arranged on a light source plate 5, and a power supply module 7 for supplying power required by the light source module L1. The lighting device D1 may also be provided with a controller, a heat dissipation device, a light distribution component and the like according to the function and requirement of the specific lamp. The controller may be used to adjust the color and intensity of illumination light emitted by the light source module L1, and the light distribution component may be a lampshade, a lens, a diffusion element, a light guide, etc. in addition to the diffusion plate in the example.

A specific example of the light source module L1 of the present disclosure is a mixed light white LED package chip which may be an LED chip with a general patch package structure or a COB package structure. As shown in FIG. 1, the light source module L1 at least includes a first luminous element 1 and a package part 2 covering the first luminous element.

The first luminous element 1 is a blue LED chip which is directly excited by the semiconductor material to emit light. The peak wavelength of the first luminous element 1 is in a range of 435~465 nm, and the light color is blue. Here, the light emitted by the first luminous element 1 is regarded as the first color light. The LED chip includes the formal-chip, the flip-chip, a single LED chip, or a plurality of LED chips connected together in series, parallel or series-parallel mode.

The package part 2 adopts transparent silica gel or transparent resin as the base material 204, and the transparent resin refers to one of epoxy resin and urea resin. The base material 204 is doped with a first additional illuminant 201, a second additional illuminant 202 and a third additional illuminant 203. The first additional illuminant 201 is the blue-green fluorescent powder that receives part of the light emitted by the first luminous element 1 and converts it into the second color light with a peak wavelength of 485~515 nm and a half width of 25~65 nm. The second additional illuminant 202 comprises at least one of yellow fluorescent powder and green fluorescent powder with a peak wavelength of 520~580 nm, a half-width of the emission spectrum of 60~115 nm, and an optional half-width of 90~115 nm. Because color is an intuitive feeling of human body, it is impossible to accurately divide the spectral boundary between yellow and green. In this application, fluorescent powder with the peak wavelength of 520~540 nm is regarded as green fluorescent powder and fluorescent powder with the peak wavelength of 540~580 nm is regarded as yellow fluorescent powder. In this application, the second additional illuminant 202 may choose one of yellow fluorescent powder and green fluorescent powder, but in order to provide better color rendering, the second additional illuminant in this example adopts the scheme of adopting both yellow fluorescent powder and green fluorescent powder. That is, the second additional illuminant is a combination of yellow fluorescent powder and green fluorescent powder, and the combined fluorescent powder receives part of the light emitted by the first luminous element 1 and converts it into the third color light with the peak wavelength of 520~580 nm. The third additional illuminant 203 is red or orange fluorescent powder that receives part of the light emitted by the first luminous element 1 and converts it into the fourth color light with a peak wavelength of 615~655 nm, a half-width of 80~120 nm, and an optional half-width of 80~100 nm. Light diffusion agent may also be included in the package part 2, and the light diffusion agent may be one of nanometer titanium oxide, aluminum oxide or silicon oxide. The above-mentioned fluorescent powders and light diffusion agent are weighed in proportion and mixed into the base material 204, and then fully and uniformly stirred in a blender so that the fluorescent powders and light diffusion agent are uniformly distributed in the base material 204. After removing bubbles, the base material 204 mixed with the fluorescent powders is covered on the blue LED chip as the first luminous element 1 by using a dispensing machine, so as to form the package part 2.

The various fluorescent powders which are used will be illustrated below. For the convenience of description, the total fluorescent powder weight is defined as the sum of the weight of the first additional illuminant, the weight of the second additional illuminant and the weight of the third additional illuminant. The total fluorescent powder weight accounts for 25~50% of the package part 2. The weight of the package part 2 is the total weight of the base material 204 after mixing the fluorescent powders and the light diffusion agent.

The blue-green fluorescent powder which serves as the first additional illuminant 201 accounts for 18.0~50.0% of the total fluorescent powder weight, and the first additional illuminant 201 may be any one of the following fluorescent powders or a mixture of two or more of the following fluorescent powders. The specific fluorescent powder types are as follows (in the present disclosure, the molar ratio is expressed by x): (a) nitrogen oxide, with $Eu^{2+}$ as an activator, and the general formula of chemical composition is $(Ba,Ca)_{1-x}Si_2N_2O_2:Eu_x$, where x=0.005~0.200; (b) Ga-doped garnet fluorescent powder with $Eu^{2+}$ as an activator, a general formula of chemical composition is Ga-LuAG:Eu; (c) silicate fluorescent powder, with $Eu^{2+}$ as an activator, a general formula of chemical composition is $Ba_2SiO_4:Eu$.

In this example, the combination of yellow fluorescent powder and green fluorescent powder which serves as the second additional illuminant 202 accounts for 22.0~52.0% of the total fluorescent powder weight. As mentioned above, there is no obvious boundary between yellow and green, and there is no clear definition between yellow fluorescent powder and green fluorescent powder, they basically have the same chemical general formula, but the difference lies in the different molar ratio of the component. In this example, two fluorescent powders with different peak wavelengths are selected for combination in the 520~580 nm band. One of two fluorescent powders is the yellow fluorescent powder of which peak wavelength is greater than 540 nm, and the other is the green fluorescent powder of which peak wavelength is less than 540 nm. In this example, the yellow fluorescent powder and the green fluorescent powder with different peak wavelengths are selected for combination, mainly to improve the display effect and make the whole spectrum smoother. In other preferred examples, only one kind of yellow fluorescent powder or green fluorescent powder may achieve the same CS value, but the display effect may be slightly worse than this example. The specific yellow fluorescent powder/green fluorescent powder may be any one or a mixture of more than two of the following fluorescent powders: (a) garnet structure fluorescent powder with $Ce^{3+}$ as an activator, a general formula of chemical composition is $(M1)_{3-x}(M2)_5O_{12}:Ce_x$, where M1 is at least one element among Y, Lu, Gd and La, M2 is at least one element of Al and Ga, and x=0.005~0.200; (b) silicate system fluorescent powder with $Eu^{2+}$ as an activator, a general formula of chemical composition is $(M3)_{2-x}SiO_4:Eu_x$ or $(Ba,Ca,Sr)_{2-x}(Mg,Zn)Si_2O_7:Eu_x$, where M3 is at least one element among Mg, Sr, Ca and Ba, and x=0.01~0.20; (c) nitrogen oxide fluorescent powder (Cylon β-SiAlON), with $Eu^{2+}$ as an activator, a general formula of chemical composition is $Si_bAl_cO_dN_e:Eu_x$, where x=0.005~0.400, b+c=12, d+e=16; (d) aluminate system fluorescent powder, with $Eu^{2+}$ as an activator, a general formula of chemical composition is $(Sr,Ba)_{2-x}Al_2O_4:Eu_x$ or $(Sr,Ba)_{4-x}Al_{14}O_{25}:Eu_x$, where x=0.01~0.15.

The red or orange fluorescent powder which serves as the third additional illuminant 203 accounts for 8.0~38.0% of the total fluorescent powder weight. The third additional illuminant 203 may be any one of the following fluorescent powders, or a mixture of two or more of the following fluorescent powders. The specific fluorescent powder types are as follows (in the present disclosure, x represents the molar ratio): (a) nitride red powder with 1113 crystal structure and using $Eu^{2+}$ as an activator, a general formula of chemical composition is $(M4)_{1-x}AlSiN_3:Eu_x$, where M4 is at least one element among Ca, Sr, and Ba, and x=0.005~0.300; (b) nitride red powder with 258 crystal structure and using $Eu^{2+}$ as an activator, a general formula of chemical composition is $(M5)_{2-x}Si_5N_8:Eu_x$, where M5 is at least one element among Ca, Sr, Ba and Mg, and x=0.005~0.300; (c) nitrogen oxide fluorescent powder (Cylon α-SiAlON) with $Eu^{2+}$ as an activator, a general formula of chemical composition is $((M6)_{1-a})_xSi_bAl_cO_dN_e:Eu_a$, where M6 is at least one element among Li, Na, K, Rb, Cs, Sr, Ba, Sc, Y, La, and Gd, x=0.15~1.5, a=0.005~0.300, b+c=12, d+e=16; (d)

silicate fluorescent powder with $Eu^{2+}$ as an activator, a general formula of chemical composition is $(Sr,Ba)_{3-x}Si_5O_5:Eu_x$, where x=0.005~0.300.

The types of fluorescent powders that may be selected are given above. In this application, 8 examples are provided, and in these examples, 9 kinds of fluorescent powders are selected. The parameters and chemical formulas of the fluorescent powders selected in the examples are shown in the following table. For the convenience of description, the code for the fluorescent powder is defined in Table 1, and this code is used to describe the fluorescent powder in the subsequent description of the examples, instead of describing the peak value and chemical formula of the fluorescent powder in detail in each example.

TABLE 1

| No | Color | Code | x | y | Peak (nm) | Hw (nm) | chemical reaction |
|---|---|---|---|---|---|---|---|
| 1 | red | R650 | 0.6692 | 0.3305 | 647.9 | 86.6 | $Ca_{1-x}AlSiN3:Eu_x$, |
| 2 | red | R640 | 0.6453 | 0.3540 | 639.2 | 95.1 | (x = 0.01~0.10) |
| 3 | red | R630 | 0.6377 | 0.3617 | 627.8 | 94.2 | |
| 4 | yellow | Y550 | 0.4165 | 0.5423 | 545.5 | 115.8 | $(Y,Gd)3-x(Ga,Al)5O12:Ce_x$, |
| 5 | yellow | Y565 | 0.4546 | 0.5161 | 560.7 | 121.7 | (x = 0.008~0.10) |
| 6 | Green 1 | G-Ga535 | 0.3564 | 0.5679 | 529.3 | 106.2 | $Y_{3-x}(Ga,Al)5O12:CE_x$, |
|   |   |   |   |   |   |   | (x = 0.01~0.10) |
| 7 | Green 2 | G-L535 | 0.3780 | 0.5658 | 538.5 | 107.6 | $(Lu,Gd,La)_{3-x}Al_5O_{12}:Ce_x$, |
|   |   |   |   |   |   |   | (x = 0.005~0.15) |
| 8 | blue-green 1 | BG490 | 0.0761 | 0.4539 | 495.4 | 31.6 | $Ba1-xSi2N2O2:Eu_x$, |
|   |   |   |   |   |   |   | (x = 0.008~0.18) |
| 9 | blue-green 2 | BG500 | 0.0645 | 0.4675 | 500.0 | 38.1 | $(Lu,Gd,La)_{3-x}Al_5O_{12}:Ce_x$, |
|   |   |   |   |   |   |   | (x = 0.005~0.15) |

The parameters in the above table are all for this kind of fluorescent powder, x and y represent the coordinate values of the fluorescent powder color in CIE1931 color space, and Peak represents the peak wavelength and Hw represents the half width. The above values are the actual values of fluorescent powder used in the examples, and are not a limitation of the disclosure, because in actual production, due to the difference of fluorescent powder purity and particle size, the peak wavelength and the half width of fluorescent powder may be slightly deviated from the above data, and this deviation value may generally be controlled within ±5 nm. It should be considered that other solutions within this range are equivalent to the above-mentioned fluorescent powder.

Table 2 shows eight examples of this application, the types of fluorescent powders used in each example, and the weights of various fluorescent powders. The proportion of each additional illuminant refers to the proportion of the weight of the fluorescent powders in each additional illuminant in the total fluorescent powder weight. The total fluorescent powder ratio refers to the total fluorescent powder weight, that is, the ratio of all fluorescent powders included in the three additional illuminants in the total weight of the package part 2 after mixing these fluorescent powders with the base material 204. In these examples, the base material 204 is transparent silica gel with a weight of 10 g.

TABLE 2

| | First Additional Illuminant | | | Second Additional Illuminant | | | Third Additional Illuminant | | | Total fluorescent powder ratio |
|---|---|---|---|---|---|---|---|---|---|---|
| | Code | Weight(g) | proportion | Code | Weight(g) | proportion | Code | Weight(g) | proportion | |
| Embodiment 1 | BG490 | 1.60 | 32.5% | Y565 | 0.66 | 40.2% | R630 | 1.35 | 27.4% | 33.0% |
| | | | | G-L535 | 1.32 | | | | | |
| Embodiment 2 | BG490 | 1.51 | 24.1% | Y550 | 0.65 | 45.8% | R630 | 1.88 | 30.0% | 38.5% |
| | | | | G-Ga535 | 2.22 | | | | | |
| Embodiment 3 | BG490 | 1.30 | 26.7% | Y565 | 0.86 | 43.7% | R630 | 1.44 | 29.6% | 32.8% |
| | | | | G-Ga535 | 1.27 | | | | | |
| Embodiment 4 | BG490 | 1.35 | 31.8% | Y565 | 0.52 | 36.9% | R640 | 1.33 | 31.3% | 29.8% |
| | | | | G-Ga535 | 1.05 | | | | | |
| Embodiment 5 | BG490 | 1.22 | 24.9% | Y550 | 0.72 | 45.4% | R650 | 1.45 | 29.7% | 32.8% |
| | | | | G-L535 | 1.10 | | | | | |
| | | | | G-Si525 | 0.40 | | | | | |

TABLE 2-continued

|  | First Additional Illuminant | | | Second Additional Illuminant | | | Third Additional Illuminant | | | Total fluorescent powder ratio |
| --- | --- | --- | --- | --- | --- | --- | --- | --- | --- | --- |
|  | Code | Weight(g) | proportion | Code | Weight(g) | proportion | Code | Weight(g) | proportion |  |
| Embodiment 6 | BG500 | 1.25 | 25.8% | Y565 | 0.62 | 44.9% | R650 | 1.42 | 29.3% | 32.7% |
|  |  |  |  | G-Ga53S | 1.56 |  |  |  |  |  |
| Embodiment 7 | BG490 | 1.34 | 30.0% | Y550 | 0.80 | 36.9% | R630 | 1.48 | 33.1% | 30.9% |
|  |  |  |  | G-Ga535 | 0.85 |  |  |  |  |  |
| Embodiment 8 | BG490 | 1.02 | 21.7% | Y550 | 0.92 | 43.8% | R630 | 2.10 | 34.5% | 37.8% |
|  | BG500 | 0.30 |  | G-Ga535 | 1.75 |  |  |  |  |  |

The fluorescent powder weights in Table 2 are all the data when the sample chip of the light source module L1 is manufactured. In actual batch production, different batches of fluorescent powder will have slightly different weights, but basic proportion of the fluorescent powder is in a fixed interval. The application of various fluorescent powders is mainly to control the energy ratio of the mixed emitted light within the specified wavelength, because the energy distribution affects the CS value of the emitted light (the specific calculation method of CS value will be explained in detail when the example spectrum is introduced below), a basic requirement for the energy distribution in each interval is needed when designing the chip. Here, only the spectrum in the visible range is discussed, so the entire spectrum energy described below refers to the total spectrum energy in the visible range, that is, the wavelength range [380~780 nm]. The spectrum of the emitted light of the chip is: the spectrum energy in the wavelength range [380~470 nm] accounts for 10.0%~30.0% of the entire spectrum energy, and the optional range is 15.0%~25.0%; the spectral energy in the wavelength range (470~560 nm] accounts for 25.0%~45.0% of the entire spectral energy, and the optional range is 27.0%~37.0%; the spectral energy in the wavelength range (560~780 nm] accounts for 40.0%~60.0% of the entire spectral energy, and the optional range is 45.0%~55.0%. In the previous RGB light mixing schemes, the (470~520 nm] section was usually a trough with little energy in it. In this application, this section is of particular concern, and the CS value is increased by increasing the energy in this section. Therefore, it is required that the spectral energy in this section should account for 12.0%~32.0% of the entire spectral energy, optionally 17.0%~27.0%.

In the case where the energy division in each spectral section is basically determined, the fluorescent powders are also prepared with this goal. The energy in the wavelength range [380~470 nm] is provided by the blue LED chip of the first luminous element 1. In fact, all the energy of the emitted light is provided by the first luminous element 1. Originally, all the energy should be concentrated in this section. However, because some light is converted into other light colors by the fluorescent powder, the converted energy is distributed in other wavelength ranges, and the energy remaining in this section is less than 30%. The spectral energy in the wavelength range (470~560 nm] is mainly provided by the first additional illuminant 201 and the second additional illuminant 202 after converting part of the emitted light of the first luminous element 1. Here, the main reason is that the spectrum is continuous, and the emitted light of the first luminous element 1 is not completely devoid of energy in this section, but the energy after conversion is relatively small. When designing the chip, the part of fluorescent powder conversion is mainly considered, choosing a more appropriate powder weight ratio, and then actually measuring the energy in this section. The measured energy must include the energy provided by each illuminant, but the first additional illuminant 201 and the second additional illuminant 202 play a major role in this section. It can be seen from Table 2 that the blue-green fluorescent powder which serves as the first additional illuminant 201 accounts for 21.7% to 32.5% of the total fluorescent powder weight. Considering that other kinds of fluorescent powders may also be used, it is considered in this application that the proportion of the first additional illuminant 201 in the total fluorescent powder weight should be within the range of 18% to 50%. In this application, the second additional illuminant 202 is added to mainly increase the energy in the (470~520 nm] section, but the energy in this section should not be too high, otherwise it will affect the white light color. It can be seen from Table 2 that the fluorescent powder used as the second additional illuminant 202 is basically a combination of yellow fluorescent powder and green fluorescent powder, and the second additional illuminant 202 accounts for 36.9% to 45.8% of the total fluorescent powder weight. In this application, the proportion of the second additional illuminant 202 in the total fluorescent powder weight should be in the range of 22.0~52.0%. The spectral energy in the wavelength range (560~780 nm] is mainly provided by red fluorescent powder or orange fluorescent powder which serves as the third additional illuminant 203. In Table 2, the proportion of the third additional illuminant 203 in the total fluorescent powder weight ranges from 27.4% to 34.5%, and it is further considered that the proportion of fluorescent powder other than those in the examples may be expanded to 8%~38%. These fluorescent powders may be coated on the LED chip by mixing with the transparent silica gel, or the remote fluorescent powders may be provided far away from the chip, or some of them may be mixed with packaging glue and some of them may be provided on the external surface, which is not limited in this application.

The function of each additional illuminant in the light source module 1 is to receive part of the light emitted by the first luminous element 1 and convert the light into other colors different from the first color. In this example, the first color light, the second color light, the third color light and the fourth color light are mixed to form the emitted light of the light source module L1, the emitted light of the light source module L1 is white light in the CIE1931 color space, and the emitted light is within an interval surrounded by points with a correlated color temperature of 5000±350K and a distance from the blackbody locus of duv=−0.006~0.006.

With reference to the above table, each implementation is explained in detail.

Figure 4:
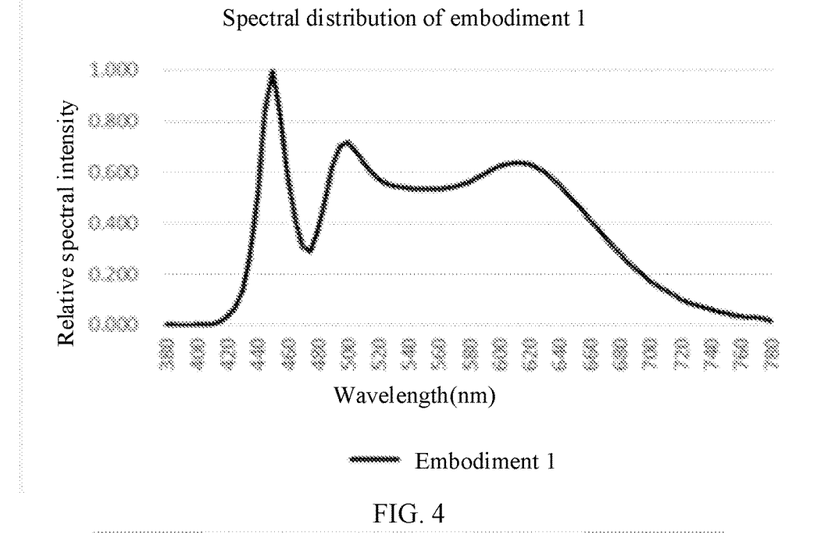
FIG. 4 is a spectrogram of emitted light according to one or more examples of the present disclosure.

In example 1, the first luminous element 1 in the light source module L1 is a blue LED chip with peak=450 nm. 1.35 g of red fluorescent powder with code R630 is used as the third additional illuminant 203. The second additional illuminant 202 is composed of yellow fluorescent powder with code Y565 and green fluorescent powder with code G-L535, the yellow fluorescent powder has a weight of 0.66 g, and the green fluorescent powder has a weight of 1.32 g. 1.60 g of blue-green fluorescent powder with code BG490 is used as the first additional illuminant 201. The above fluorescent powders are put into transparent silica gel of a weight of 10.00 g, then mixed evenly by a blender, coated on a blue LED chip, and dried to remove bubbles, and then a positive white LED chip is obtained, the spectrum of the chip is shown in FIG. 4, and the specific luminous characteristics are shown in Table 3.

Figure 5:
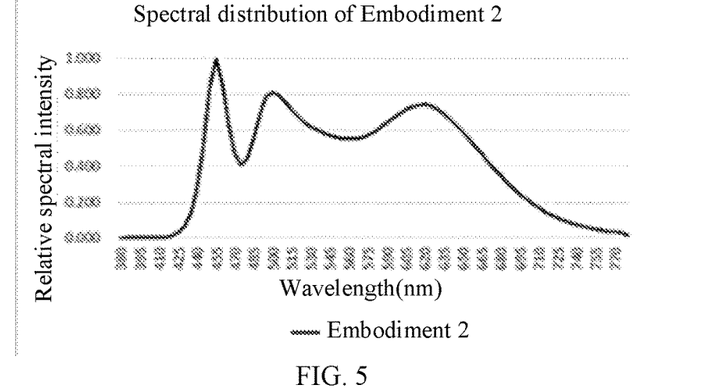
FIG. 5 is a spectrogram of emitted light according to one or more examples of the present disclosure.

In example 2, in the light source module L1, the first luminous element 1 is a blue LED chip with peak=455 nm. 1.88 g of red fluorescent powder with code R630 is used as the third additional illuminant 203. The second additional illuminant 202 is composed of yellow fluorescent powder with code Y550 and green fluorescent powder with code G-Ga535, the yellow fluorescent powder has a weight of 0.65 g, and the green fluorescent powder has a weight of 2.22 g. 1.51 g of blue-green fluorescent powder with code BG490 is used as the first additional illuminant 201. The above fluorescent powders and 0.1 g of light diffusion agent nano titanium oxide are put into 10.00 g of transparent silica gel, and then mixed evenly by a blender, coated on a blue LED chip, and then dried to remove bubbles, and then a positive white LED chip is obtained, the spectrum of the chip is shown in FIG. 5, and the specific luminous characteristics are shown in Table 3.

Figure 6:
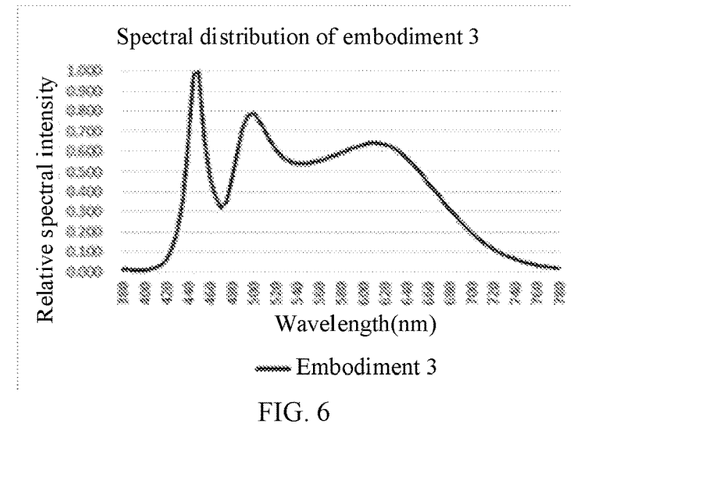
FIG. 6 is a spectrogram of emitted light according to one or more examples of the present disclosure.

In example 3, in the light source module L1, the first luminous element 1 is a blue LED chip with Peak=450 nm. 1.44 g of red fluorescent powder with code R630 is used as the third additional illuminant 203. The second additional illuminant 202 is composed of yellow fluorescent powder with code Y565 and green fluorescent powder with code G-Ga535, the yellow fluorescent powder has a weight of 0.86 g, and the green fluorescent powder has a weight of 1.27 g. 1.30 g of blue-green fluorescent powder with code BG490 is used as the first additional illuminant 201. The above fluorescent powders are put into 10.00 g of transparent silica gel, then mixed evenly by a blender, coated on a blue LED chip, and dried to remove bubbles, and then a positive white LED chip is obtained, the spectrum of the chip is shown in FIG. 6, and the specific luminous characteristics are shown in Table 3.

Figure 7:
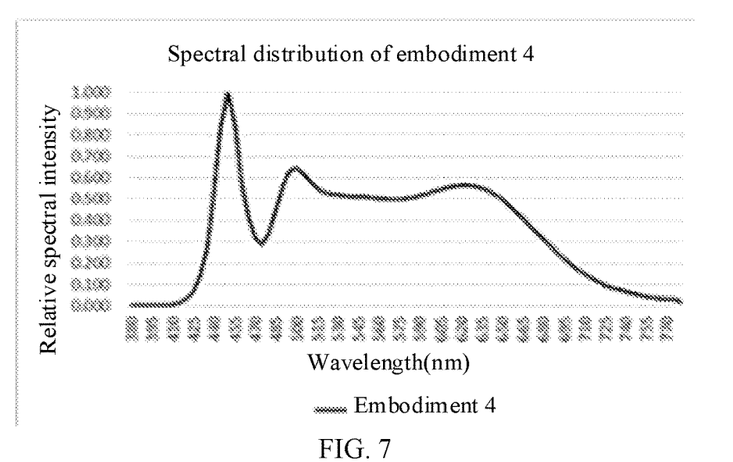
FIG. 7 is a spectrogram of emitted light according to one or more examples of the present disclosure.

In example 4, in the light source module L1, the first luminous element 1 is a blue LED chip with Peak=450 nm. 1.33 g of red fluorescent powder with code R640 is used as the third additional illuminant 203. The second additional illuminant 202 is composed of yellow fluorescent powder with code Y565 and green fluorescent powder with code G-Ga535, the yellow fluorescent powder has a weight of 0.52 g, and the green fluorescent powder has a weight of 1.05 g. 1.35 g of blue-green fluorescent powder with code BG490 is used as the first additional illuminant 201. The above fluorescent powders are put into transparent silica gel, mixed evenly by a blender, coated on a blue LED chip, and dried to remove bubbles, and then a positive white LED chip is obtained, the spectrum of the chip is shown in FIG. 7, and the specific luminous characteristics are shown in Table 3.

Figure 8:
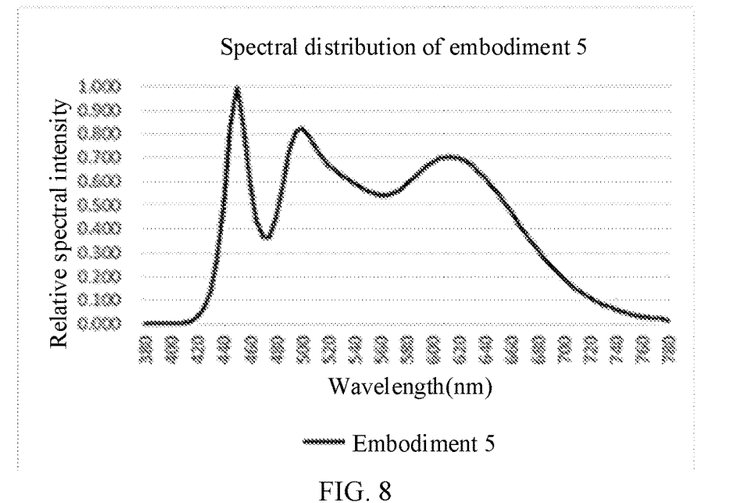
FIG. 8 is a spectrogram of emitted light according to one or more examples of the present disclosure.

In example 5, in the light source module L1, the first luminous element 1 is a blue LED chip with Peak=450 nm. 1.45 g of red fluorescent powder with code R650 is used as the third additional illuminant 203. The second additional illuminant 202 is composed of yellow fluorescent powder with code Y550, green fluorescent powder with code G-L535, and green fluorescent powder with code G-Si525, yellow fluorescent powder has a weight of 0.72 g, green fluorescent powder G-L535 has a weight of 1.10 g, and green fluorescent powder G-Si525 has a weight of 0.40 g. 1.22 g of blue-green fluorescent powder with code BG490 is used as the first additional illuminant 201. The above fluorescent powders are put into transparent silica gel, then mixed evenly by a blender, coated on a blue LED chip, and dried to remove bubbles, and then a positive white LED chip is obtained, the spectrum of the chip is shown in FIG. 8, and the specific luminous characteristics are shown in Table 3.

Figure 9:
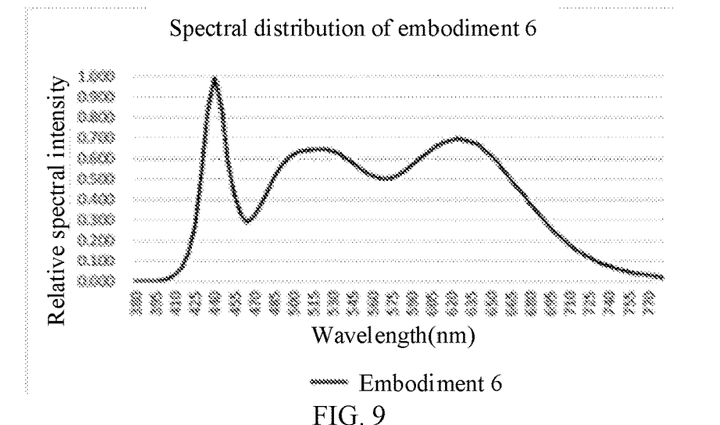
FIG. 9 is a spectrogram of emitted light according to one or more examples of the present disclosure.

In example 6, in the light source module L1, the first luminous element 1 is a blue LED chip with Peak=440 nm. 1.42 g of red fluorescent powder with code R650 is used as the third additional illuminant 203. The second additional illuminant 202 is composed of the yellow fluorescent powder with code Y565 and the green fluorescent powder with code G-Ga535, the yellow fluorescent powder has a weight of 0.62 g, and the green fluorescent powder has a weight of 1.56 g. 1.25 g of blue-green fluorescent powder with code BG500 is used as the first additional illuminant 201. The above fluorescent powders are put into transparent silica gel, mixed evenly by a blender, coated on a blue LED chip, and dried to remove bubbles, and then a positive white LED chip is obtained, the spectrum of the chip is shown in FIG. 9, and the specific luminous characteristics are shown in Table 3.

Figure 10:
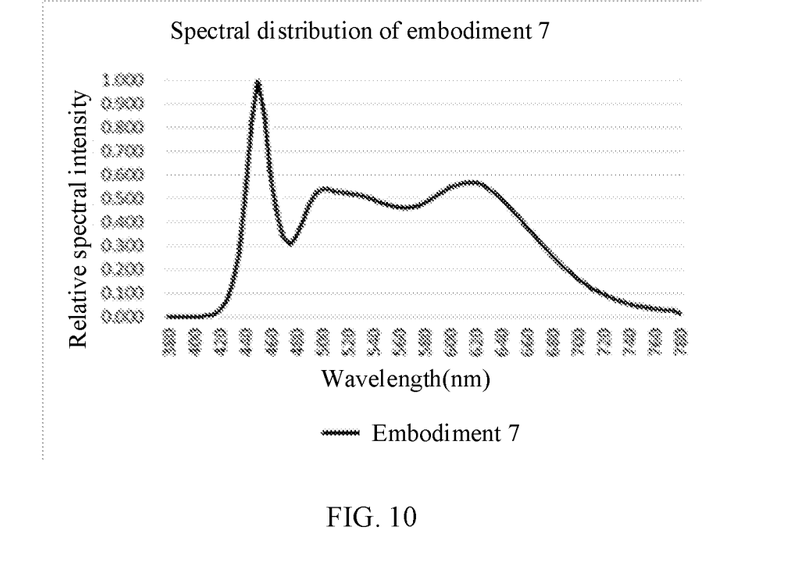
FIG. 10 is a spectrogram of emitted light according to one or more examples of the present disclosure.

In example 7, in the light source module L1, the first luminous element 1 is a blue LED chip with Peak=450 nm. 1.48 g of red fluorescent powder with code R630 is used as the third additional illuminant 203. The second additional illuminant 202 is composed of yellow fluorescent powder with code Y550 and green fluorescent powder with code G-Ga535, the yellow fluorescent powder has a weight of 0.80 g, and the green fluorescent powder has a weight of 0.85 g. 1.34 g of blue-green fluorescent powder with code BG490 is used as the first additional illuminant 201. The above fluorescent powders are put into transparent silica gel, then mixed evenly by a blender, coated on a blue LED chip, and dried to remove bubbles, and then a positive white LED chip is obtained, the spectrum of the chip is shown in FIG. 10, and the specific luminous characteristics are shown in Table 3.

Figure 11:
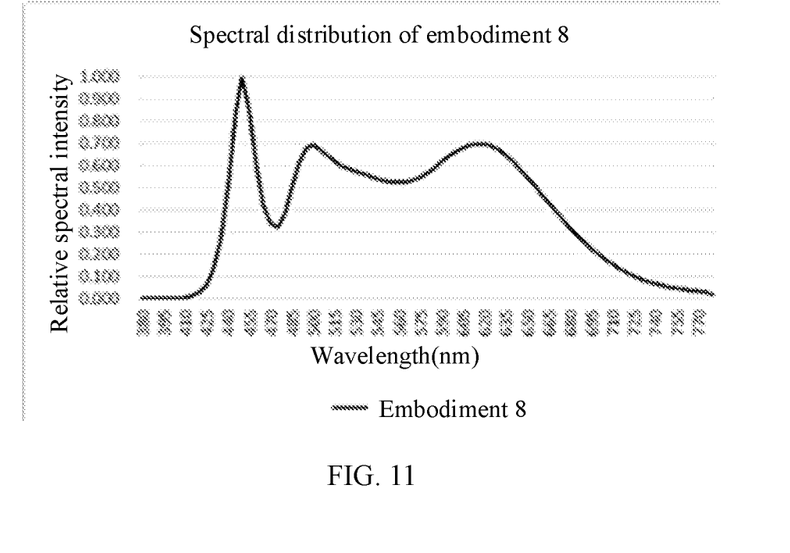
FIG. 11 is a spectrogram of emitted light according to one or more examples of the present disclosure.

In example 8, in the light source module L1, the first luminous element 1 is a blue LED chip with Peak=450 nm. 2.10 g of red fluorescent powder with code R630 is used as the third additional illuminant 203. The second additional illuminant 202 is composed of yellow fluorescent powder with code Y550 and green fluorescent powder with code G-Ga535, the yellow fluorescent powder has a weight of 0.92 g, and the green fluorescent powder has a weight of 1.75 g. 1.02 g of blue-green fluorescent powder with code BG490 and 0.30 g of blue-green fluorescent powder with code BG500 are used as the first additional illuminant 201. The above fluorescent powders are put into transparent silica gel, then mixed evenly by a blender, coated on a blue LED chip, and dried to remove bubbles, and then a positive white LED chip is obtained, the spectrum of the chip is shown in FIG. 11, and the specific luminous characteristics are shown in Table 3.

TABLE 3

| | x | y | CCT | duv | CRI | CS_500 lux |
|---|---|---|---|---|---|---|
| Embodiment 1 | 0.3450 | 0.3517 | 5002 | 0.000 | 95.23 | 0.436 |
| Embodiment 2 | 0.3531 | 0.3642 | 4761 | 0.003 | 90.23 | 0.422 |
| Embodiment 3 | 0.3418 | 0.3514 | 5126 | 0.001 | 94.80 | 0.441 |
| Embodiment 4 | 0.3383 | 0.3442 | 5252 | −0.001 | 95.74 | 0.449 |
| Embodiment 5 | 0.3459 | 0.3577 | 4989 | 0.003 | 92.93 | 0.432 |

TABLE 3-continued

| | x | y | CCT | duv | CRI | CS_500 lux |
|---|---|---|---|---|---|---|
| Embodiment 6 | 0.3469 | 0.3460 | 4908 | −0.004 | 90.46 | 0.435 |
| Embodiment 7 | 0.3391 | 0.3382 | 5203 | −0.004 | 94.90 | 0.442 |
| Embodiment 8 | 0.3519 | 0.3514 | 4743 | −0.003 | 93.23 | 0.431 |

The characteristics of luminescence of light source module L1 in examples 1-8 are listed in table 3, where x and y represent the coordinate values of light color emitted by the light source module L1 on x and y axes in CIE1931 color coordinate system, CCT is color temperature, duv represents the distance and direction of color deviation from Planck locus in color coordinate system, and CRI is color rendering index. In this application, the CS value of 500 lux indicates the CS value of the emitted light of the light source module L1 when the illumination is 500 lux, and the specific calculation formula is as follows:

$$CS = 0.7 - \frac{0.7}{1 + \left(\frac{CL_A}{355.7}\right)^{1.1026}}$$

where, $CL_A = 1548 \times \left\{ \int Mc(\lambda)P(\lambda)d\lambda + \right.$ $0.7 \times \left( \int \frac{s(\lambda)}{mp(\lambda)}P(\lambda)d\lambda - 0.2616 \times \int \frac{v(\lambda)}{mp(\lambda)}P(\lambda)d\lambda \right) -$ $\left. 3.3 \times \left(1 - e^{\left(\frac{\int V'(\lambda)*P(\lambda)*d\lambda'}{-6.5}\right)}\right) \right\}$, if $\left( \int \frac{s(\lambda)}{mp(\lambda)}P(\lambda)d\lambda - 0.2616 \times \int \frac{v(\lambda)}{mp(\lambda)}P(\lambda)d\lambda \right) > 0$;

$CL_A = 1548 \times \left\{ \int Mc(\lambda)P(\lambda)d\lambda \right\}$, if $\left( \int \frac{s(\lambda)}{mp(\lambda)}P(\lambda)d\lambda - 0.2616 \times \int \frac{V(\lambda)}{mp(\lambda)}P(\lambda)d\lambda \right) \leq 0$.

In the formula, $$P(\lambda) = \frac{500 \times P_0(\lambda)}{683 \times \sum V(\lambda)P_0(\lambda)d\lambda},$$

$P_0(\lambda)$: spectral distribution of light source; $P(\lambda)$: spectral distribution of light source corresponding to 500 lux; $Mc(\lambda)$: visual melanin sensitivity curve corrected by lens transmittance; $S(\lambda)$: sensitivity curve of S-shaped cone cells; $mp(\lambda)$: macular pigment transmittance; $V(\lambda)$: photopic vision optical efficiency function; $V'(\lambda)$: scotopic vision optical efficiency function. The calculation formula is based on the light conduction mathematical model of human rhythm published by LRC.

Figure 3:
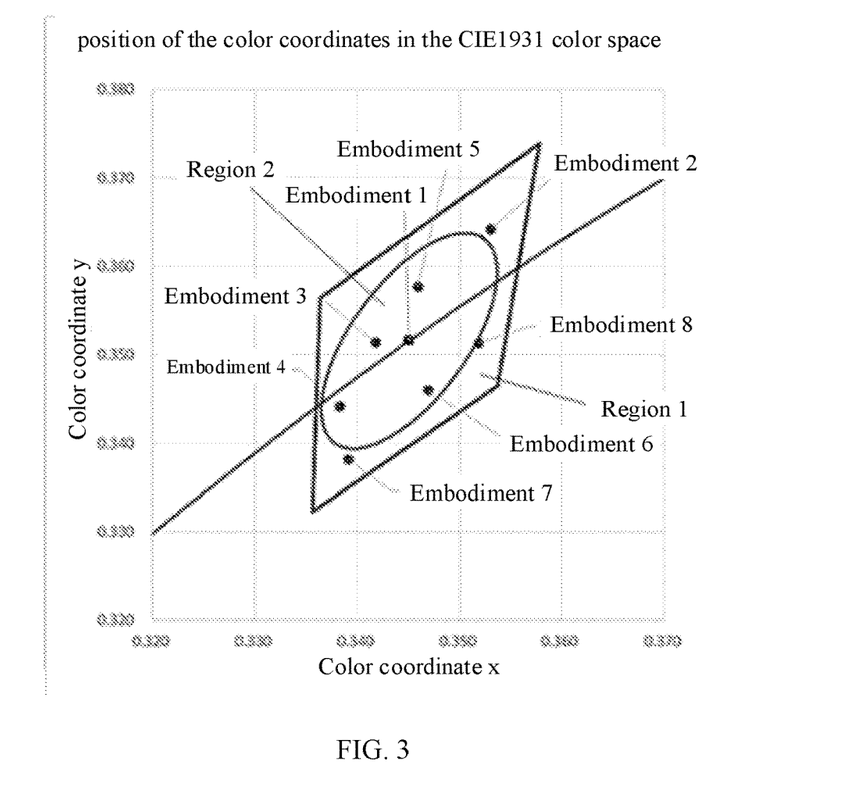
FIG. 3 is a CIE1931 color coordinate diagram in accordance with some examples of the present disclosure.

From Table 3, it can be seen that the CS value of the emitted light of the light source module L1 of all examples is greater than 0.42 when the illumination is 500 lux, and the color rendering index of the emitted light is consistent with CRI≥90.0. The light color of each example is marked on the color coordinate system. As shown in FIG. 3, the light colors of each example are all located near the blackbody locus with the correlated color temperature of 5000±350 K, and the distance from the blackbody locus BBL is less than 0.006, that is, duv is in the range of −0.006~0.006. And all the points fall within the quadrilateral region surrounded by vertex D1(0.3364,0.3564), vertex D2(0.3356,0.3323), vertex D3(0.3537,0.3465) and vertex D4(0.3578,0.3739), that is, the illustrated region 1. After the user experiment on these examples in the later stage, it can be found that the effects of examples 1, 3, 4, 5 and 6 are better, and from FIG. 3, it can be seen that these points all fall within the illustrated region 2, and the region 2 is an ellipse with the center point x0=0.3541 and y0=0.3516, the major axis a=0.00274, the minor axis b=0.00118, the inclination angle θ=59.4°, and the SDCM=5.0.

Figure 2:
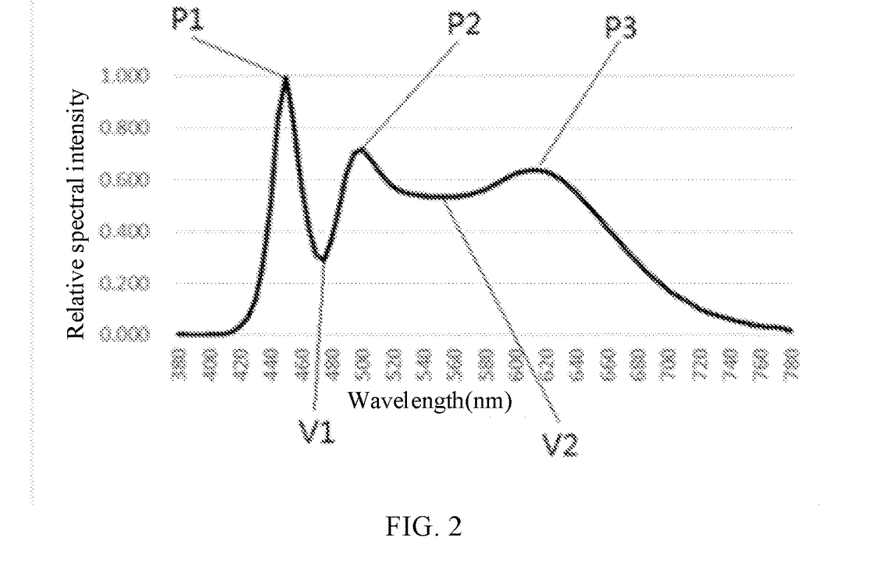
FIG. 2 is a schematic diagram of spectral characteristics of a light source module according to an example of the present disclosure.

The reason why these examples can achieve higher CS value is mainly due to the energy distribution of the emitted light at different wavelengths. These characteristics are more specifically reflected in the waveform characteristics of the spectrum besides the different energy distribution in different wavelength sections. FIG. 2 is a schematic spectrogram that best reflects the spectral characteristics of the emitted light of the light source module L1 in this application, and the spectral characteristics of this application are explained according to FIG. 2. It can be seen from FIG. 2 that the spectrum of the emitted light includes a first peak P1, a first peak-valley V1, a second peak P2, a second peak-valley V2 and the third peak P3 which are distributed in sequence.

The first peak P1 is within the wavelength range of 435~465 nm. Because the light source module L1 uses the blue LED chip as the excitation light source, although a large part of the light emitted by the blue LED chip is wavelength-converted by the additional illuminants, some energy remains unconverted, and these energy forms the first peak in the wavelength range of 435~465 nm. The point P1 may have the same peak wavelength as the blue LED chip, because the energy of this peak mainly comes from the first luminous element 1. The light converted by each additional illuminant may also have some energy in this wavelength range, and after the two are mixed, the first peak P1 may not completely coincide with the original peak wavelength position of the blue LED chip of the first luminous element 1, and may drift slightly, but is still in the wavelength range of 435~465 nm. The first peak P1 is basically within [380~470 nm], so the energy in the wavelength range of [380~470 nm] is mainly the energy of the first peak P1.

The second peak P2 is within the wavelength range of 485~525 nm, and the energy of the second peak P2 is provided by the blue-green light, and the blue-green light is converted by the blue-green fluorescent powder of the first additional illuminant 201 after receiving part of the light emitted by the blue LED chip of the first luminous element 1. The ratio of the spectral intensity of the second peak P2 to the spectral intensity of the first peak P1 is between 50% and 90%, optionally 60% to 80%.

The third peak P3 is within the wavelength range of 595~645 nm, and the energy of the third peak P3 is provided by the red light, and the red light is converted by the red or orange fluorescent powder of the third additional illuminant 203 after receiving part of the light emitted by the blue LED chip of the first luminous element 1. The ratio of the spectral intensity of the third peak P3 to the spectral intensity of the first peak P1 is between 50% and 80%, optionally 45% to 60%. The spectral energy of the emitted light in the wavelength range of (560~780 nm] is mainly provided by the third peak P3.

The first peak-valley V1 is the lowest spectral point between the first peak P1 and the second peak P2, and the energy at the bottoms of the two peaks are superimposed here, so the ratio of the spectral intensity of the first peak-valley V1 to the spectral intensity of the first peak P1 is greater than or equal to 25.0%.

The second peak-valley V2 is the lowest spectral point between the second peak P2 and the third peak P3. Because the distance between the second peak P2 and the third peak P3 is far, the spectral energy of the emitted light in the wavelength range (470~560 nm] cannot be guaranteed to account for 25.0%~45.0% of the entire spectral energy only depending on the energy of the second peak P2. Therefore, in this application, a second additional illuminant 202 is added, and the second additional illuminant 202 receives the yellow-green light converted from part of the light emitted by the blue LED chip of the first luminous element 1, and the energy distribution of the yellow-green light is in the range of (470~520 nm]. The energy distribution raises the second peak-valley V2 at the same time, so that the ratio of the spectral intensity of the second peak-valley V2 to the spectral intensity of the first peak P1 is between 50.0% and 70.0%, optionally 40.0% to 60.0%. In general, using one of the yellow fluorescent powder or the green fluorescent powder for the second additional illuminant may also ensure the energy ratio there, however, the spectrum fluctuates greatly, which may form another peak between the second peak P2 and the third peak P3. Of course, the appearance of the new peak will not affect the CS value of the whole spectrum, and the second peak-valley V2 is still the lowest point of the spectrum between the second peak P2 and the third peak P3. However, in consideration of the color rendering, the energy distribution in this section should be more uniform. Therefore, in alternative examples 1~8, the second additional illuminant 202 uses a mixture of two fluorescent powders with different peak wavelengths, and the two fluorescent powders may be selected with different colors, that is, one is the yellow fluorescent powder and the other is the green fluorescent powder. After the two fluorescent powders are mixed, the main energy in the wavelength range (470~520 nm] is provided after converting part of the light emitted by the first luminous element 1. The energy in the wavelength range of (470~570 nm] is provided together by the first additional illuminant 201 and the second additional illuminant 202.

The above peak positions may basically guarantee the energy ratio in each section, but further limiting the peak energy ratio between the second peak P2 and the third peak P3 can obtain better luminous effect, and can further ensure the high CS value, high luminous efficiency and high color rendering. In a preferred example, the ratio of the spectral intensity of the third peak P3 to the spectral intensity of the second peak P2 is between 75% and 115%, optionally 80% to 110%.

In FIG. 2, it can be seen that the spectrum of the emitted light is continuously distributed. The so-called continuous distribution means that the spectrum curve is relatively flat, and there is no large energy fluctuation between two adjacent points. As shown in FIGS. 4-11 of each example, there is no point with spectral energy of 0 between the peaks, and such a spectrum curve can ensure that every point in 380~780 nm has a certain energy distribution, which makes the spectrum have better color rendering.

Table 4 lists the characteristic values of each spectrum in examples 1~8. P1, P2, P3, V1 and V2 in the table refer to the wavelength of the first peak P1, the wavelength of the second peak P2, the wavelength of the third peak P3, the wavelength of the first peak-valley V1, and the wavelength of the second peak-valley V2, respectively. The unit is nm. I_P2/I_P1 refers to the ratio of spectral intensity of second peak P2 to that of the first peak P1, I_P3/I_P1 refers to the ratio of spectral intensity of third peak P3 to that of the first peak P1, I_V1/I_P1 refers to the ratio of spectral intensity of first peak-valley V1 to that of the first peak P1, I_V2/I_P1 refers to the ratio of the spectral intensity of the second peak-valley V2 to that of the first peak P1, and I_P3/I_P1 refers to the ratio of the spectral intensity of the third peak P3 to that of the second peak P2.

TABLE 4

|  | P1(nm) | P2(nm) | P3(nm) | V1(nm) | V2(nm) | I_P2/ I_P1 | I_P3/ I_P1 | I_V1/ I_P1 | I_V2/ I_P1 | I_P3/ I_P2 |
| --- | --- | --- | --- | --- | --- | --- | --- | --- | --- | --- |
| Embodiment 1 | 450.0 | 500.0 | 610.0 | 475.0 | 555.0 | 71.5% | 63.5% | 29.2% | 53.3% | 88.9% |
| Embodiment 2 | 455.0 | 500.0 | 620.0 | 475.0 | 560.0 | 81.1% | 74.1% | 40.8% | 55.3% | 91.4% |
| Embodiment 3 | 450.0 | 500.0 | 610.0 | 470.0 | 545.0 | 78.9% | 64.2% | 32.1% | 54.0% | 81.3% |
| Embodiment 4 | 450.0 | 500.0 | 620.0 | 475.0 | 575.0 | 64.2% | 56.5% | 28.3% | 49.8% | 88.0% |
| Embodiment 5 | 450.0 | 500.0 | 610.0 | 475.0 | 565.0 | 82.4% | 70.4% | 36.4% | 54.2% | 85.5% |
| Embodiment 6 | 440.0 | 520.0 | 625.0 | 465.0 | 570.0 | 64.3% | 69.6% | 28.8% | 49.9% | 108.2% |
| Embodiment 7 | 450.0 | 500.0 | 615.0 | 475.0 | 565.0 | 53.8% | 56.8% | 30.4% | 46.1% | 105.7% |
| Embodiment 8 | 450.0 | 500.0 | 615.0 | 475.0 | 560.0 | 69.2% | 69.7% | 32.3% | 52.5% | 100.7% |

These feature values all fall within the spectral features described above. Because of these features, examples 1~8 with these spectral features can achieve the energy proportion in the specific section. Table 5 lists the ratio of energy in the designated sections of each spectrum of examples 1~8. I_Σ [380-470] nm, I_Σ (470-520] nm, I_Σ [475-560] nm, I_Σ (560-780] nm represent the proportion of spectral energy of the listed wavelength range in the entire spectral energy, respectively.

TABLE 5

|  | I_Σ[380- 470]nm | I_Σ(470- 520]nm | I_Σ(475- 560]nm | I_Σ(560- 780]nm |
| --- | --- | --- | --- | --- |
| Embodiment 1 | 16.9% | 19.2% | 33.8% | 49.3% |
| Embodiment 2 | 14.5% | 20.1% | 34.3% | 51.2% |
| Embodiment 3 | 16.9% | 20.4% | 34.4% | 48.7% |
| Embodiment 4 | 17.7% | 18.3% | 32.8% | 49.5% |
| Embodiment 5 | 15.8% | 20.6% | 35.1% | 49.1% |
| Embodiment 6 | 17.4% | 17.5% | 31.9% | 50.7% |
| Embodiment 7 | 18.9% | 17.6% | 32.3% | 48.8% |
| Embodiment 8 | 16.3% | 18.4% | 32.6% | 51.2% |

The energy ratio of each section in Table 5 can ensure that examples 1~8 achieve luminescence characteristics of high CS value.

A spectrum of the emitted light has following characteristics: defining spectral energy of the spectrum of the emitted light in a visible light range within a wavelength range [380~780 nm] as entire spectral energy of the emitted light; spectral energy of the emitted light in a wavelength range [380~470 nm] accounting for 10.0%~30.0% of the entire spectral energy; spectral energy of the emitted light in a wavelength range (470~560 nm] accounting for 25.0%~45.0% of the entire spectral energy; spectral energy of the emitted light in a wavelength range (560~780 nm] accounting for 40.0%~60.0% of the entire spectral energy; and spectral energy of the emitted light in a wavelength range (470~520 nm] accounting for 12.0%~32.0% of the entire spectral energy.

Further, the spectrum of the emitted light is: spectral energy of the emitted light in a wavelength range [380~470 nm] accounting for 15.0%~25.0% of the entire spectral energy; spectral energy of the emitted light in a wavelength range (470~560 nm] accounting for 27.0%~37.0% of the entire spectral energy; spectral energy of the emitted light in a wavelength range (560~780 nm] accounting for 45.0%~55.0% of the entire spectral energy; and spectral energy of the emitted light in a wavelength range (470~520 nm] accounting for 17.0%~27.0% of the entire spectral energy.

Further, the spectrum of the emitted light is continuously distributed in the visible light range of 380~780 nm, and the spectrum of the emitted light comprises three peaks and two peak-valleys. A first peak is within a wavelength range of 435~465 nm; a second peak is within a wavelength range of 485~525 nm, and a ratio of a spectral intensity of the second peak to a spectral intensity of the first peak is between 50.0% and 90.0%; a first peak-valley is located between the first peak and the second peak, and a ratio of a spectral intensity of the first peak-valley to the spectral intensity of the first peak is greater than or equal to 25.0%; a third peak is within a wavelength range of 595~645 nm, and a ratio of a spectral intensity of the third peak to the spectral intensity of the first peak is between 50.0% and 80.0%; and a second peak-valley is located between the second peak and the third peak, and a ratio of a spectral intensity of the second peak-valley to the spectral intensity of the first peak is between 40.0% and 70.0%.

Further, the spectrum of the emitted light is: the ratio of the spectral intensity of the second peak to the spectral intensity of the first peak being between 60.0% and 80.0%; the ratio of the spectral intensity of the third peak to the spectral intensity of the first peak being between 55.0% and 70.0%; and the ratio of the spectral intensity of the second peak-valley to the spectral intensity of the first peak being between 45.0% and 60.0%.

Further, the spectrum of the emitted light is: a ratio of the spectral intensity of the third peak to the spectral intensity of the second peak being between 75% and 115%.

Further, the spectrum of the emitted light is: the ratio of the spectral intensity of the third peak to the spectral intensity of the second peak being between 80% and 110%.

Further, the first luminous element is a blue LED with a peak wavelength of 435~465 nm; the first additional illuminant is blue-green fluorescent powder with a peak wavelength of 485~515 nm and a half width of 25~65 nm; the second additional illuminant is yellow fluorescent powder and/or green fluorescent powder with a peak wavelength of 520~580 nm and a half width of 60~115 nm; the third additional illuminant is red fluorescent powder or orange fluorescent powder with a peak wavelength of 615~655 nm and a half width of 80~120 nm; and a sum of a weight of the first additional illuminant, a weight of the second additional illuminant and a weight of the third additional illuminant is defined as a total fluorescent powder weight.

Further, the first additional illuminant accounts for 18.0%~50.0% of the total fluorescent powder weight.

Further, the second additional illuminant accounts for 22.0%~52.0% of the total fluorescent powder weight.

Further, the third additional illuminant accounts for 8.0%~38.0% of the total fluorescent powder weight.

Further, the blue-green fluorescent powder is any one or a mixture of two or more of following fluorescent powder: (a) nitrogen oxides with $Eu^{2+}$ as an activator, a general formula of chemical composition is $(Ba,Ca)_{1-x}Si_2N_2O_2:Eu_x$, where x=0.005~0.200; (b)

Ga-doped garnet fluorescent powder with $Eu^{2+}$ as an activator, a general formula of chemical composition is Ga-LuAG:Eu; (c) silicate fluorescent powder, with $Eu^{2+}$ as an activator, a general formula of chemical composition is $Ba_2SiO_4$:Eu.

Further, the yellow fluorescent powder or the green fluorescent powder is any one or a mixture of two or more of following fluorescent powder: (a) garnet structure fluorescent powder with $Ce^{3+}$ as an activator, a general formula of chemical composition is $(M1)_{3-x}(M2)_5O_{12}:Ce_x$, where M1 is at least one element among Y, Lu, Gd and La, M2 is at least one element of Al and Ga, and x=0.005~0.200; (b) silicate system fluorescent powder with $Eu^{2+}$ as an activator, a general formula of chemical composition is $(M3)_{2-x}SiO_4$:$Eu_x$ or $(Ba,Ca,Sr)_{2-x}(Mg,Zn)Si_2O_7:Eu_x$, where M3 is at least one element among Mg, Sr, Ca and Ba, and x=0.01~0.20; (c) nitrogen oxide fluorescent powder (Cylon β-SiAlON), with $Eu^{2+}$ as an activator, a general formula of chemical composition is $Si_bAl_cO_dN_e:Eu_x$, where x=0.005~0.400, b+c=12, d+e=16; (d) aluminate system fluorescent powder, with $Eu^{2+}$ as an activator, a general formula of chemical composition is $(Sr,Ba)_{2-x}Al_2O_4:Eu_x$ or $(Sr,Ba)_{4-x}Al_{14}O_{25}:Eu_x$, where x=0.01~0.15.

Further, the red fluorescent powder or the orange fluorescent powder is any one or a mixture of two or more of following fluorescent powder: (a) nitride red powder with 1113 crystal structure and using $Eu^{2+}$ as an activator, a general formula of chemical composition is $(M4)_{1-x}AlSiN_3$:$Eu_x$, where M4 is at least one element among Ca, Sr, and Ba, and x=0.005~0.300; (b) nitride red powder with 258 crystal structure and using $Eu^{2+}$ as an activator, a general formula of chemical composition is $(M5)_{2-x}Si_5N_8:Eu_x$, where M5 is at least one element among Ca, Sr, Ba and Mg, and x=0.005~0.300; (c) nitrogen oxide fluorescent powder (Cylon α-SiAlON) with $Eu^{2+}$ as an activator, a general formula of chemical composition is $((M6)_{1-a})Si_bAl_cO_dN_e:Eu_a$, where M6 is at least one element among Li, Na, K, Rb, Cs, Sr, Ba, Sc, Y, La, and Gd, x=0.15~1.5, a=0.005~0.300, b+c=12, d+e=16; (d)

silicate fluorescent powder with $Eu^{2+}$ as an activator, a general formula of chemical composition is $(Sr,Ba)_{3-x}Si_5O_5$:$Eu_x$.

Further, the package part further comprises a base material and a light diffusion agent, the base material is silica gel or resin, and the light diffusion agent is one of nanometer titanium oxide, aluminum oxide or silicon oxide.

Further, a light color of the emitted light of the light source module is within a quadrilateral region surrounded by vertex D1(0.3364,0.3564), vertex D2(0.3356,0.3323), vertex D3(0.3537,0.3465), and vertex D4(0.3578,0.3739) in CIE1931 color space.

Further, the light color of the emitted light of the light source module is within an ellipse with a center point x0=0.3541 and y0=0.3516, a major axis a=0.00274, a minor axis b=0.00118, an inclination angle θ=59.4°, SDCM=5.0 in CIE1931 color space.

Further, a CS value of the emitted light of the light source module is greater than or equal to 0.42 in the case where an illumination of the emitted light is 500 lux.

Further, a color rendering index CRI of the emitted light of the light source module is greater than or equal to 90.0.

The present disclosure further provides a lighting device, which comprises the light source module described above.

The light source module provided by the present disclosure provides an LED positive white light (5000K) light source with high light efficiency, high CS value and high color rendering property by controlling the proportion of luminous energy of the emitted light in different wavelength regions. Under the same illumination, the spectrum with high CS value is beneficial for people to concentrate on studying and working, and is especially suitable for classroom lighting.

The above description of alternative examples of the present disclosure is for illustration and description, and is not intended to be exhaustive or limited to the specific forms disclosed. Obviously, many modifications and changes may be made, which may be obvious to those skilled in the art and should be included within the scope of the present disclosure as defined by the appended claims.

What is claimed is:

1. A light source module, comprising:
   a first luminous element and a package part covering the first luminous element,
   wherein the first luminous element emits first color light with a peak wavelength of 435~465 nm;
   wherein the package part comprises:
      a first additional illuminant, arranged to receive part of light emitted by the first luminous element and convert the part of light into second color light with a peak wavelength of 485~515 nm,
      a second additional illuminant, arranged to receive part of light emitted by the first luminous element and convert the part of light into third color light with a peak wavelength of 520~580 nm, and
      a third additional illuminant, arranged to receive part of light emitted by the first luminous element and convert the part of light into fourth color light with a peak wavelength of 615~655 nm;
   wherein the first color light, the second color light, the third color light, and the fourth color light are mixed to form emitted light of the light source module, and the emitted light is neutral white light in CIE1931 color space, and the emitted light is within an interval surrounded by points with a correlated color temperature of 5000±350K and a distance from blackbody locus of duv=−0.006~0.006.

2. The light source module according to claim 1, wherein a spectrum of the emitted light has following characteristics:
   defining spectral energy of the spectrum of the emitted light in a visible light range within a wavelength range [380~780 nm] as entire spectral energy of the emitted light;
   spectral energy of the emitted light in a wavelength range [380~470 nm] accounting for 10.0%~30.0% of the entire spectral energy;
   spectral energy of the emitted light in a wavelength range (470~560 nm] accounting for 25.0%~45.0% of the entire spectral energy;
   spectral energy of the emitted light in a wavelength range (560~780 nm] accounting for 40.0%~60.0% of the entire spectral energy; and
   spectral energy of the emitted light in a wavelength range (470~520 nm] accounting for 12.0%~32.0% of the entire spectral energy.

3. The light source module according to claim 1, wherein the spectrum of the emitted light is:
   spectral energy of the emitted light in a wavelength range [380~470 nm] accounting for 15.0%~25.0% of the entire spectral energy;
   spectral energy of the emitted light in a wavelength range (470~560 nm] accounting for 27.0%~37.0% of the entire spectral energy;
   spectral energy of the emitted light in a wavelength range (560~780 nm] accounting for 45.0%~55.0% of the entire spectral energy; and
   spectral energy of the emitted light in a wavelength range (470~520 nm] accounting for 17.0%~27.0% of the entire spectral energy.

4. The light source module according to claim 1, wherein the spectrum of the emitted light is continuously distributed in the visible light range of 380~780 nm, and the spectrum of the emitted light comprises three peaks and two peak-valleys, wherein
   a first peak is within a wavelength range of 435~465 nm;
   a second peak is within a wavelength range of 485~525 nm, and a ratio of a spectral intensity of the second peak to a spectral intensity of the first peak is between 50.0% and 90.0%;
   a first peak-valley is located between the first peak and the second peak, and a ratio of a spectral intensity of the first peak-valley to the spectral intensity of the first peak is greater than or equal to 25.0%;
   a third peak is within a wavelength range of 595~645 nm, and a ratio of a spectral intensity of the third peak to the spectral intensity of the first peak is between 50.0% and 80.0%; and
   a second peak-valley is located between the second peak and the third peak, and a ratio of a spectral intensity of the second peak-valley to the spectral intensity of the first peak is between 40.0% and 70.0%.

5. The light source module according to claim 4, wherein the spectrum of the emitted light is:
   the ratio of the spectral intensity of the second peak to the spectral intensity of the first peak being between 60.0% and 80.0%;
   the ratio of the spectral intensity of the third peak to the spectral intensity of the first peak being between 55.0% and 70.0%; and
   the ratio of the spectral intensity of the second peak-valley to the spectral intensity of the first peak being between 45.0% and 60.0%.

6. The light source module according to claim 4, wherein the spectrum of the emitted light is:
   a ratio of the spectral intensity of the third peak to the spectral intensity of the second peak being between 75% and 115%.

7. The light source module according to claim 6, wherein the spectrum of the emitted light is:
   the ratio of the spectral intensity of the third peak to the spectral intensity of the second peak being between 80% and 110%.

8. The light source module according to claim 1, wherein the first luminous element is a blue LED with a peak wavelength of 435~465 nm;
   the first additional illuminant is blue-green fluorescent powder with a peak wavelength of 485~515 nm and a half width of 25~65 nm;
   the second additional illuminant is yellow fluorescent powder and/or green fluorescent powder with a peak wavelength of 520~580 nm and a half width of 60~115 nm;

the third additional illuminant is red fluorescent powder or orange fluorescent powder with a peak wavelength of 615~655 nm and a half width of 80~120 nm; and a sum of a weight of the first additional illuminant, a weight of the second additional illuminant and a weight of the third additional illuminant is defined as a total fluorescent powder weight.

9. The light source module according to claim 8, wherein the first additional illuminant accounts for 18.0~50.0% of the total fluorescent powder weight.

10. The light source module according to claim 8, wherein the second additional illuminant accounts for 22.0%~52.0% of the total fluorescent powder weight.

11. The light source module according to claim 8, wherein the third additional illuminant accounts for 8.0%~38.0% of the total fluorescent powder weight.

12. The light source module according to claim 8, wherein the blue-green fluorescent powder is any one or a mixture of two or more of following fluorescent powder:
(a) nitrogen oxides with $Eu^{2+}$ as an activator,
a general formula of chemical composition is $(Ba,Ca)_{1-x}Si_2N_2O_2:Eu_x$, where x=0.005~0.200;
(b) Ga-doped garnet fluorescent powder with $Eu^{2+}$ as an activator,
a general formula of chemical composition is Ga-LuAG: Eu;
(c) silicate fluorescent powder, with $Eu^{2+}$ as an activator,
a general formula of chemical composition is $Ba_2SiO_4$: Eu.

13. The light source module according to claim 8, wherein the yellow fluorescent powder or the green fluorescent powder is any one or a mixture of two or more of following fluorescent powder:
(a) garnet structure fluorescent powder with $Ce^{3+}$ as an activator,
a general formula of chemical composition is $(M1)_{3-x}(M2)_5O_{12}:Ce_x$, where M1 is at least one element among Y, Lu, Gd and La, M2 is at least one element of Al and Ga, and x=0.005~0.200;
(b) silicate system fluorescent powder with $Eu^{2+}$ as an activator,
a general formula of chemical composition is $(M3)_{2-x}SiO_4:Eu_x$ or $(Ba,Ca,Sr)_{2-x}(Mg,Zn)Si_2O_7:Eu_x$, where M3 is at least one element among Mg, Sr, Ca and Ba, and x=0.01~0.20;
(c) nitrogen oxide fluorescent powder (Cylon β-SiAlON), with $Eu^{2+}$ as an activator,
a general formula of chemical composition is $Si_bAl_cO_dN_e:Eu_x$, where x=0.005~0.400, b+c=12, d+e=16;
(d) aluminate system fluorescent powder, with $Eu^{2+}$ as an activator,
a general formula of chemical composition is $(Sr,Ba)_{2-x}Al_2O_4:Eu_x$ or $(Sr,Ba)_{4-x}Al_{14}O_{25}:Eu_x$, where x=0.01~0.15.

14. The light source module according to claim 8, wherein the red fluorescent powder or the orange fluorescent powder is any one or a mixture of two or more of following fluorescent powder:
(a) nitride red powder with 1113 crystal structure and using $Eu^{2+}$ as an activator,
a general formula of chemical composition is $(M4)_{1-x}AlSiN_3:Eu_x$, where M4 is at least one element among Ca, Sr, and Ba, and x=0.005~0.300;
(b) nitride red powder with 258 crystal structure and using $Eu^{2+}$ as an activator,
a general formula of chemical composition is $(M5)_{2-x}Si_5N_8:Eu_x$, where M5 is at least one element among Ca, Sr, Ba and Mg, and x=0.005~0.300;
(c) nitrogen oxide fluorescent powder (Cylon α-SiAlON) with $Eu^{2+}$ as an activator,
a general formula of chemical composition is $((M6)_{1-a})_xSi_bAl_cO_dN_e:Eu_a$, where M6 is at least one element among Li, Na, K, Rb, Cs, Sr, Ba, Sc, Y, La, and Gd, x=0.15~1.5, a=0.005~0.300, b+c=12, d+e=16;
(d) silicate fluorescent powder with $Eu^{2+}$ as an activator,
a general formula of chemical composition is $(Sr,Ba)_{3-x}Si_5O_5:Eu_x$.

15. The light source module according to claim 8, wherein the package part further comprises a base material and a light diffusion agent, the base material is silica gel or resin, and the light diffusion agent is one of nanometer titanium oxide, aluminum oxide or silicon oxide.

16. The light source module according to claim 1, wherein a light color of the emitted light of the light source module is within a quadrilateral region surrounded by vertex D1(0.3364,0.3564), vertex D2(0.3356,0.3323), vertex D3(0.3537,0.3465), and vertex D4(0.3578,0.3739) in CIE1931 color space.

17. The light source module according to claim 16, wherein the light color of the emitted light of the light source module is within an ellipse with a center point x0=0.3541 and y0=0.3516, a major axis a=0.00274, a minor axis b=0.00118, an inclination angle θ=59.4°, SDCM=5.0 in CIE1931 color space.

18. The light source module according to claim 1, wherein a CS value of the emitted light of the light source module is greater than or equal to 0.42 in a case where an illumination of the emitted light is 500 lux.

19. The light source module according to claim 1, wherein a color rendering index CRI of the emitted light of the light source module is greater than or equal to 90.0.

20. A lighting device, wherein the lighting device comprises the light source module according to claim 1.

* * * * *